United States Patent
Han et al.

(10) Patent No.: US 8,933,445 B2
(45) Date of Patent: Jan. 13, 2015

(54) FUNCTIONAL THIN FILM FOR TOUCH SCREEN AND METHOD FOR FORMING THE SAME

(71) Applicant: Research & Business Foundation Sungkyunkwan University, Suwon-si (KR)

(72) Inventors: Jeongeon Han, Seoul (KR); Yoonseok Choi, Suwon-si (KR); Su Bong Jin, Suwon-si (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 0 days.

(21) Appl. No.: 13/726,414

(22) Filed: Dec. 24, 2012

(65) Prior Publication Data
US 2013/0181213 A1    Jul. 18, 2013

(30) Foreign Application Priority Data

Dec. 26, 2011 (KR) .................. 10-2011-0142117
Feb. 6, 2012 (KR) .................. 10-2012-0011773

(51) Int. Cl.
 *H01L 29/12* (2006.01)
 *G06F 3/041* (2006.01)
 *H01L 29/66* (2006.01)
 *H01L 29/24* (2006.01)

(52) U.S. Cl.
 CPC .............. *H01L 29/24* (2013.01); *G06F 3/0414* (2013.01); *H01L 29/66969* (2013.01)
 USPC ......................................................... 257/43

(58) Field of Classification Search
 USPC .......................................................... 257/43
 See application file for complete search history.

(56) References Cited

U.S. PATENT DOCUMENTS

| 8,284,472 | B2 * | 10/2012 | Yoshimura et al. | 359/270 |
|---|---|---|---|---|
| 8,354,143 | B2 * | 1/2013 | Halsey et al. | 427/372.2 |
| 2009/0160819 | A1 * | 6/2009 | Sasaki et al. | 345/174 |
| 2010/0033818 | A1 * | 2/2010 | Petcavich et al. | 359/507 |
| 2010/0188726 | A1 * | 7/2010 | Yoshimura et al. | 359/270 |
| 2011/0109588 | A1 | 5/2011 | Makinen et al. | |
| 2011/0216020 | A1 * | 9/2011 | Lee et al. | 345/173 |

FOREIGN PATENT DOCUMENTS

WO    WO 2011/058225 A1    5/2011

* cited by examiner

*Primary Examiner* — Thao P Le
(74) *Attorney, Agent, or Firm* — NSIP Law

(57) ABSTRACT

Provided is a functional thin film having a transparent substrate; a transparent semiconductor layer that is formed on the transparent substrate and contains an oxide transparent in a visible ray region; and an insulating protective film formed on the transparent semiconductor layer, wherein a surface resistance of the transparent semiconductor layer is in a range of from 10 MΩ/□ to 100 MΩ/□.

18 Claims, 5 Drawing Sheets

FUNCTIONAL THIN FILM FOR TOUCH SCREEN AND METHOD FOR FORMING THE SAME

CROSS REFERENCE TO RELATED APPLICATIONS

This application claims the benefit under 35 U.S.C. §119 (a) of Korean Patent Application No. 10-2011-0142117 filed on Dec. 26, 2011 and Korean Patent Application No. 10-2012-0011773 filed on Feb. 6, 2012, in the Korean Intellectual Property Office, the entire disclosures of both which are incorporated herein by reference for all purposes.

FIELD OF THE INVENTION

The present disclosure relates to a functional thin film for a touch screen and a method for forming the same.

BACKGROUND OF THE INVENTION

As a mobile display-related industry using touch screens such as smartphones and tablet PCs develops, a next-generation touch screen has been demanded, and many studies thereof have been carried out. In particular, a study of an electrosensory haptic touch screen capable of recognizing a user's touch by generating an electric field on a screen has been carried out.

U.S. Patent Laid-open Publication No. US2011/0109588 (entitled "Tactile stimulation apparatus having a composite section comprising a semiconducting material") describes a configuration of an electrosensory haptic touch screen. The electrosensory haptic touch screen described in US2011/0109588 can be used by being closely pressed on a general capacitive touch screen.

FIG. 1 is an explanatory diagram of an electrosensory haptic touch screen. Referring to FIG. 1, the electrosensory haptic touch screen includes a semiconductor layer 20 substantially serving as an electrode and an insulating layer 30 stacked on the semiconductor layer 20 and configured to prevent an electric current flow generated by a touch input device such as a finger on the semiconductor layer 20. Such an electrosensory haptic touch screen may be provided on a conventional capacitive touch screen 10 as depicted in FIG. 1.

If the electrosensory haptic touch screen is provided on the capacitive touch screen 10, the electrosensory haptic touch screen and the capacitive touch screen 10 generally cannot be operated in optimal conditions for display use.

Further, when the electrosensory haptic touch screen is touched by a user, electric charges are accumulated on the insulating layer 30. Since the electric charges are accumulated on the insulating layer 30, an overall function of the electrosensory haptic touch screen may be deteriorated.

The electrosensory haptic touch screen including the semiconductor layer 20 and the insulating layer 30 is integrally manufactured with the capacitive touch screen 10. Therefore, if the electrosensory haptic touch screen malfunctions, a consumer needs to replace the capacitive touch screen 10 as well as the electrosensory haptic touch screen, which is a financial burden to the consumer.

Furthermore, the electrosensory haptic touch screen described in US2011/0109588 cannot be applied to a pliable or bendable touch screen due to its problem of flexibility.

BRIEF SUMMARY OF THE INVENTION

In view of the foregoing, some illustrative embodiments of the present disclosure provide a functional thin film including a semiconductor layer having a surface resistance appropriately adjusted to operate a capacitive touch screen in optimal conditions with secured transparency in a visible ray region and a method for forming the functional thin film.

Further, some illustrative embodiments of the present disclosure provide a functional thin film including a flexible substrate which can be changed in shape and applied to a pliable or bendable touch screen and a method for forming the functional thin film.

However, the problems to be solved by the present disclosure are not limited to the above description and other problems may exist.

In accordance with a first aspect of the illustrative embodiments, there is provided a functional thin film having a transparent substrate; a transparent semiconductor layer that is formed on the transparent substrate and contains an oxide transparent in a visible ray region; and an insulating protective film formed on the transparent semiconductor layer, wherein a surface resistance of the transparent semiconductor layer is in a range of from 10 MΩ/□ to 100 MΩ/□.

Further, in accordance with a second aspect of the illustrative embodiments, there is provided a functional thin film having a flexible substrate; a buffer layer formed on the flexible substrate; a transparent semiconductor layer that is formed on the buffer layer and contains an oxide transparent in a visible ray region; an insulating protective film formed on the transparent semiconductor layer; and an anti-fingerprint film formed on the insulating protective film, wherein a surface resistance of the transparent semiconductor layer is in a range of from 10 MΩ/□ to 100 MΩ/□.

Furthermore, in accordance with a third aspect of the illustrative embodiments, there is provided a functional thin film forming method including (a) forming a transparent semiconductor layer on a substrate by a sputtering method or a chemical vapor deposition method; (b) adjusting a surface resistance of the transparent semiconductor layer by performing a n-type doping process on the transparent semiconductor layer formed in the step (a); and (c) forming an insulating protective film of $SiO_x$ on the transparent semiconductor layer of which the surface resistance is adjusted in the step (b), wherein the surface resistance of the transparent semiconductor layer is in a range of from 10 MΩ/□ to 100 MΩ/□.

In accordance with the illustrative embodiments, a transparent semiconductor layer of a functional thin film contains an oxide which is transparent in a visible ray region, and, thus, transparency in the visible ray region can be guaranteed and the semiconductor layer can be applied to various display devices equipped with touch screens.

Further, in accordance with the illustrative embodiments, a functional thin film includes a transparent semiconductor layer having a surface resistance of 10 MΩ/□ to 100 MΩ/□, and, thus, if the functional thin film is provided on a capacitive touch screen, the capacitive touch screen and the functional thin film (electrosensory haptic screen) that senses electric induction can be operated in optimal conditions.

Furthermore, in accordance with the illustrative embodiments, a functional thin film includes a flexible substrate, and, thus, a pliable or bendable electrosensory haptic screen can be manufactured. The flexible electrosensory haptic screen can be applied to various products.

Moreover, in accordance with the illustrative embodiments, a functional thin film includes a flexible substrate and a buffer layer, and, thus, a surface of the flexible substrate can be planarized and an adhesive strength between the flexible substrate and a transparent semiconductor layer can be increased.

In accordance with the illustrative embodiments, a functional thin film forming method includes forming a transparent semiconductor layer by means of a sputtering method or a chemical vapor deposition method, and, thus, the transparent semiconductor layer of high quality can be formed at a low temperature.

Further, in accordance with the illustrative embodiments, a functional thin film forming method includes adjusting a n-type doping concentration for a transparent semiconductor of a functional thin film provided on a capacitive touch screen to have a surface resistance of 10 M$\Omega$/□ to 100 M$\Omega$/□. Therefore, the capacitive touch screen and the functional thin film that is transparent in a visible ray region and senses electric stimulation can be operated in optimal conditions.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which.

DETAILED DESCRIPTION OF THE INVENTION

Figure 1:
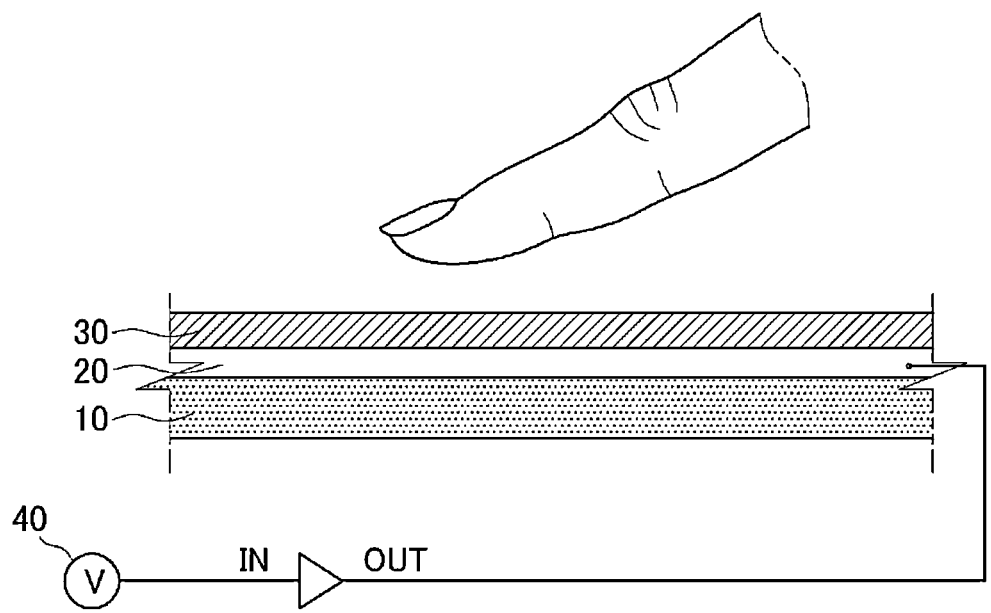
FIG. 1 is an explanatory diagram of a conventional electric electrosensory haptic screen.

Hereinafter, examples of the present disclosure will be described in detail with reference to the accompanying drawings so that the present disclosure may be readily implemented by those skilled in the art. However, it is to be noted that the present disclosure is not limited to the embodiments but can be embodied in various other ways. In drawings, parts irrelevant to the description are omitted for the simplicity of explanation, and like reference numerals denote like parts through the whole document.

Through the whole document, the term "connected to" or "coupled to" that is used to designate a connection or coupling of one element to another element includes both a case that an element is "directly connected or coupled to" another element and a case that an element is "electronically connected or coupled to" another element via still another element.

Through the whole document, the term "on" that is used to designate a position of one element with respect to another element includes both a case that the one element is adjacent to the another element and a case that any other element exists between these two elements.

Further, the term "comprises or includes" and/or "comprising or including" used in the document means that one or more other components, steps, operation and/or existence or addition of elements are not excluded in addition to the described components, steps, operation and/or elements unless context dictates otherwise. The term "about or approximately" or "substantially" are intended to have meanings close to numerical values or ranges specified with an allowable error and intended to prevent accurate or absolute numerical values disclosed for understanding of the present disclosure from being illegally or unfairly used by any unconscionable third party. Through the whole document, the term "step of" does not mean "step for".

Figure 2:
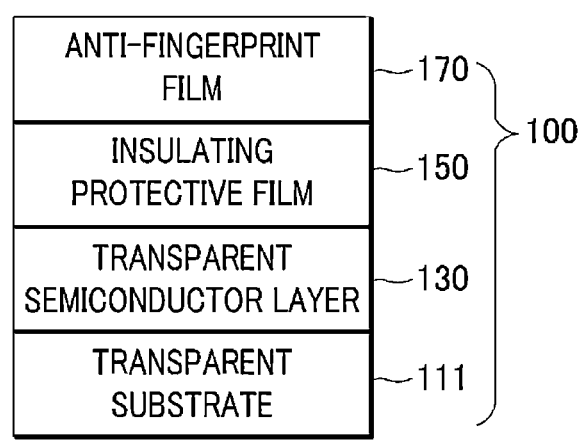
FIG. 2 is an explanatory diagram of a functional thin film in accordance with an illustrative embodiment.

FIG. 2 is an explanatory diagram of a functional thin film in accordance with an illustrative embodiment.

Referring to FIG. 2, a functional thin film 100 includes a transparent substrate 111, a transparent semiconductor layer 130, an insulating protective film 150, and an anti-fingerprint film 170 and serves as a conventional electrosensory haptic screen.

By way of example, the transparent substrate 111 may use a glass substrate. Further, although not illustrated, a touch screen to be operated by various methods publicly known can be further provided under the transparent substrate 111.

The transparent semiconductor layer 130 is provided on the transparent substrate 111 and contains an oxide which is transparent in a visible ray region. In this case, the transparent semiconductor layer 130 has a surface resistance of about 10 M$\Omega$/□ to about 100 M$\Omega$/□. Herein, $\Omega$/□ is a unit of a surface resistance and □ stands for a square. To be specific, $\Omega$/□ is not a fixed unit of 1 cm or 1 mm but a unit representing a resistance when a length along an x-axis is equal to a length along a y-axis.

If the surface resistance of the transparent semiconductor layer 130 is too low, the transparent semiconductor layer 130 is operated as a conductor and a capacitive touch screen which may be provided under the transparent substrate 111 cannot be operated normally. If the surface resistance of the transparent semiconductor layer 130 is too high, the transparent semiconductor layer 130 is operated as an insulator and the functional thin film 100 is not capacitively coupled to give electric stimulation. Therefore, desirably, the surface resistance of the transparent semiconductor layer 130 may be several ten M$\Omega$/□ in order to satisfy both conditions.

Further, the oxide which is contained in the transparent semiconductor layer 130 and is transparent in a visible ray region may be, for example, ZnO or $SnO_2$. The oxide such as ZnO or $SnO_2$ has a band gap of about 3 eV or more and allows a wavelength of about 380 nm to about 780 nm including the visible ray region to pass through. Therefore, the oxide is transparent in the visible ray region. The transparent semiconductor layer 130 may contain other oxides having a band gap that allows the visible ray region to pass through apart from the oxide such as ZnO or $SnO_2$.

Since the transparent semiconductor layer 130 containing the oxide such as ZnO or $SnO_2$ can be tailored to have the surface resistance of about 10 M$\Omega$/□ to about 100 M$\Omega$/□ by doping, the capacitive touch screen which may be provided under the transparent substrate 111 and the functional thin film 100 that is transparent in the visible ray region can be operated by capacitive coupling in optimal conditions.

To be specific, the transparent semiconductor layer 130 containing ZnO or $SnO_2$ which is a pure substance has a very high surface resistance, and, thus, the transparent semiconductor layer 130 having a surface resistance of about 10 M$\Omega$/□ to about 100 M$\Omega$/□ can be formed through a doping process. By way of example, if $SnO_2$ is used as the oxide contained in the transparent semiconductor layer 130, a doping process can be performed by using fluorine (F). If ZnO is used as the oxide contained in the transparent semiconductor layer 130, a n-type doping process can be performed by using any one of aluminum (Al), gallium (Ga), and boron (B). During the doping process, hydrogen (H) as a reaction gas can be used to obtain a certain resistance in a certain region and to improve a visible ray transmittance.

A resistance of the oxide contained in the transparent semiconductor layer 130 can be adjusted by an oxygen vacancy method. The oxygen vacancy method adjusts a degree of crystallization of the oxide contained in the transparent semiconductor layer 130 by oxygen vacancy. A resistance of the oxide such as $SnO_2$ can be adjusted.

To be specific, if a degree of crystallization of the oxide contained in the transparent semiconductor layer 130 is increased, transparency of the transparent semiconductor layer 130 can be increased. Further, if a degree of crystallization of the oxide contained in the transparent semiconductor layer 130 is increased, carrier mobility of the transparent semiconductor layer 130 can be increased, so that a resistance of the transparent semiconductor layer 130 can be decreased. Furthermore, by adjusting a degree of crystallization of the oxide contained in the transparent semiconductor layer 130, transparency of the transparent semiconductor layer 130 can be increased.

However, if only a degree of crystallization of the oxide is adjusted to adjust a resistance of ZnO as the oxide contained in the transparent semiconductor layer 130, it is difficult to maintain transparency in the visible ray region. Therefore, in case of the transparent semiconductor layer 130 containing ZnO as the oxide, a degree of crystallization sufficient to maintain transparency in the visible ray region is adjusted and a n-type doping process is performed by using the combination of hydrogen and oxygen with a proper ratio as a reaction gas. The transparent semiconductor layer 130 having desired transparency and resistance can be formed by adjusting the degree of crystallization and performing the doping process as described above.

The transparent semiconductor layer 130 may have a film thickness in a range of from about 1 nm to about several hundred nm. If the film thickness of the transparent semiconductor layer 130 is out of the range, transparency and a color thereof may be changed by interference occurring at the insulating protective film 150 to be described later. If two thin films having different refractive indexes are stacked, constructive interference and destructive interference may be caused by a change in wavelength due to interference of light. If the interference occurs, a transparent thin film may have a decrease in transparency and may appear a certain color. Therefore, by adjusting the film thickness of the transparent semiconductor layer 130 as described above, changes in transparency and color caused by interference can be minimized.

To be more specific, there will be explained a thickness of each layer for adjusting changes in transparency and color of the thin film caused by interference described above. The transparent substrate 111, the transparent semiconductor layer 130, and the insulating protective film 150 have different refractive indexes from one another. A refractive index is one of characteristic values of a substance, and, thus, interference needs to be adjusted by adjusting a thickness of each layer. By way of example, a refractive index of ZnO is greater than that of the transparent substrate 111, and, thus, a thickness may be about $\lambda/2$. The insulating protective film 150 to be described later has a refractive index in a range of from about 1.45 to about 1.5, and, thus, when the insulating protective film 150 has a thickness of about $\lambda/4$, optimal transparency can be obtained at its corresponding wavelength $\lambda$. Therefore, the transparent semiconductor layer 130 may have a film thickness in a range of from about 1 nm to about several hundred nm. The insulating protective film 150 to be described later may have a film thickness in a range of from about 500 nm to about 1 um. The transparent substrate 111 may have a film thickness of about 0.7 mm. Transparency depending on interference can be adjusted by an anti-reflection-coating method.

The insulating protective film 150 is formed on the transparent semiconductor layer 130. The insulating protective film 150 may be made of $SiO_X$ and may be formed by a PECVD method. The insulating protective film 150 can prevent an electric current flow generated by a touch input device such as a finger on the transparent semiconductor layer 130. When a touch input is made by the touch input device, capacitive coupling is generated within the insulating protective film 150 and electric stimulation can be sensed based on such coupling.

The anti-fingerprint film 170 is formed on the insulating protective film 150. The anti-fingerprint film 170 can prevent user's fingerprints from being left on a surface of the functional thin film 100. Further, by preventing the user's fingerprints from being left, the anti-fingerprint film 170 can prevent accumulation of electric charges on the insulating protective film 150. Here, the anti-fingerprint film 170 (antistatic layer) may be made of a non-conductive material such as hydrocarbon and fluorocarbon in order to prevent accumulation of electric charges on the insulating protective film 150.

Hereinafter, there will be explained a functional thin film in accordance with another illustrative embodiment.

Figure 3:
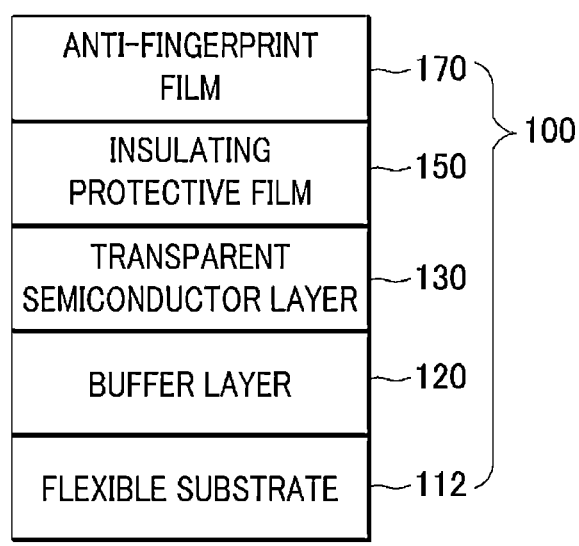
FIG. 3 is an explanatory diagram of a functional thin film in accordance with another illustrative embodiment.

FIG. 3 is an explanatory diagram of a functional thin film in accordance with another illustrative embodiment.

Referring to FIG. 3, a functional thin film 100 includes a flexible substrate 112, a buffer layer 120, a transparent semiconductor layer 130, an insulating protective film 150, and an anti-fingerprint film 170.

The flexible substrate 112 can be made of a flexible material such that the functional thin film 100 can be bent. By way of example, the flexible substrate 112 may be made of at least one of polymer materials including PET (polyethylene terephthalate), PC (polycarbonate), PI (polyimide), and PEN (polyethylene naphthalate). Further, the flexible substrate 112 may be made of glass or a plastic material such as acryl. Since the functional thin film 100 includes the flexible substrate 112, even if a touch screen is bendable and pliable, the functional thin film 100 can be organically bent or changed in shape.

The buffer layer 120 is formed on the flexible substrate 112. By way of example, as the buffer layer 120, an insulating thin film may be used. In order to use the functional thin film 100 attached to the touch screen, the thin film needs to be made of a material which is electrically insulated and optically transparent in a visible ray region. Therefore, the buffer layer 120 may be made of $SiO_X$ or $SiN_X$ which is insulated and transparent in the visible ray region.

The above-described PET, PC, PI, and PEN as materials of the flexible substrate 112 may have an uneven surface depending on a forming method thereof. Further, a material of the flexible substrate 112 has a weak adhesive strength with a material of the transparent semiconductor layer 130 to be described later. Therefore, the buffer layer 120 is needed to planarize the surface of the flexible substrate 112 and increase the weak adhesive strength between the flexible substrate 112 and the transparent semiconductor layer 130. Further, the buffer layer 120 is made of $SiO_X$ that has a refractive index similar to PET and PC as the material of the flexible substrate 112, and, thus, interface reflection caused by a difference in refractive index can be minimized.

The transparent semiconductor layer 130 is formed on the buffer layer 120 and contains an oxide which is transparent in the visible ray region. Further, a surface resistance of the transparent semiconductor layer 130 is in a range of from about 10 MΩ/□ to about 100 MΩ/□.

If the surface resistance of the transparent semiconductor layer 130 is too low, the transparent semiconductor layer 130 is operated as a conductor and a capacitive touch screen which may be provided under the flexible substrate 112 cannot be operated normally. If the surface resistance of the transparent semiconductor layer 130 is too high, the transparent semiconductor layer 130 is operated as an insulator and the functional thin film 100 cannot sense electric stimulation. Therefore, desirably, the surface resistance of the transparent semiconductor layer 130 may be several ten MΩ/□ in order to satisfy both conditions.

The oxide which is contained in the transparent semiconductor layer 130 and is transparent in a visible ray region may be, for example, ZnO or $SnO_2$. The oxide such as ZnO or $SnO_2$ has a band gap of about 3 eV or more and allows a wavelength of about 380 nm to about 780 nm including the visible ray region to pass through. Therefore, the oxide is transparent in the visible ray region. The transparent semiconductor layer 130 may contain other oxides having a band gap that allows the visible ray region to pass through apart from the oxide such as ZnO or $SnO_2$.

Since the transparent semiconductor layer 130 containing the oxide such as ZnO or $SnO_2$ has the surface resistance of about 10 MΩ/□ to about 100 MΩ/□, the capacitive touch screen which may be provided under the flexible substrate 112 and the functional thin film 100 that is transparent in the visible ray region and senses electric stimulation can be operated by capacitive coupling in optimal conditions.

To be specific, the transparent semiconductor layer 130 containing ZnO or $SnO_2$ which is a pure substance has a very high surface resistance, and, thus, the transparent semiconductor layer 130 having a surface resistance of about 10 MΩ/□ to about 100 MΩ/□ can be formed through a doping process. By way of example, if $SnO_2$ is used as the oxide contained in the transparent semiconductor layer 130, a doping process can be performed by using fluorine (F). If ZnO is used as the oxide contained in the transparent semiconductor layer 130, a n-type doping process can be performed by using any one of aluminum (Al), gallium (Ga), and boron (B). During the doping process, hydrogen (H) as a reaction gas can be used to obtain a certain resistance in a certain region and to improve a visible ray transmittance.

A resistance of the oxide contained in the transparent semiconductor layer 130 can be adjusted by an oxygen vacancy method. The oxygen vacancy method adjusts a degree of crystallization of the oxide contained in the transparent semiconductor layer 130 by oxygen vacancy. A resistance of the oxide such as $SnO_2$ can be adjusted.

To be specific, if a degree of crystallization of the oxide contained in the transparent semiconductor layer 130 is increased, transparency of the transparent semiconductor layer 130 can be increased. Further, if a degree of crystallization of the oxide contained in the transparent semiconductor layer 130 is increased, carrier mobility of the transparent semiconductor layer 130 can be increased, so that a resistance of the transparent semiconductor layer 130 can be decreased. Furthermore, by adjusting a degree of crystallization of the oxide contained in the transparent semiconductor layer 130, transparency of the transparent semiconductor layer 130 can be increased.

However, if only a degree of crystallization of the oxide is adjusted to adjust a resistance of ZnO as the oxide contained in the transparent semiconductor layer 130, it is difficult to maintain transparency in the visible ray region. Therefore, in case of the transparent semiconductor layer 130 containing ZnO as the oxide, a degree of crystallization sufficient to maintain transparency in the visible ray region is adjusted and a n-type doping process is performed by using the combination of hydrogen and oxygen with a proper ratio as a reaction gas. The transparent semiconductor layer 130 having desired transparency and resistance can be formed by adjusting the degree of crystallization and performing the doping process as described above.

The transparent semiconductor layer 130 may have a film thickness in a range of from about 1 nm to about several hundred nm. If the film thickness of the transparent semiconductor layer 130 is out of the range, transparency and a color thereof may be changed by interference occurring at the insulating protective film 150 to be described later. If two thin films having different refractive indexes are stacked, constructive interference and destructive interference may be caused by a change in wavelength due to interference of light. If the interference occurs, a transparent thin film may have a decrease in transparency and may appear a certain color. Therefore, by adjusting the film thickness of the transparent semiconductor layer 130 as described above, changes in transparency and color caused by interference can be minimized.

To be more specific, there will be explained a thickness of each layer for adjusting changes in transparency and color of the thin film caused by interference described above. The flexible substrate 112, the transparent semiconductor layer 130, and the insulating protective film 150 have different refractive indexes from one another. A refractive index is one of characteristic values of a substance, and, thus, interference needs to be adjusted by adjusting a thickness of each layer. By way of example, a refractive index of ZnO is greater than that of the flexible substrate 112, and, thus, a thickness may be about $\lambda/2$. The insulating protective film 150 to be described later has a refractive index in a range of from about 1.45 to about 1.5, and, thus, when the insulating protective film 150 has a thickness of about $\lambda/4$, optimal transparency can be obtained at its corresponding wavelength $\lambda$. Therefore, the transparent semiconductor layer 130 may have a film thickness in a range of from about 1 nm to about several hundred nm. The insulating protective film 150 to be described later may have a film thickness in a range of from about 500 nm to about 1 um. The flexible substrate 112 may have a film thickness of about 0.7 mm. Transparency depending on interference can be adjusted by an anti-reflection-coating method.

The insulating protective film 150 is formed on the transparent semiconductor layer 130. The insulating protective film 150 may be made of $SiO_X$ and may be formed by a PECVD method. The insulating protective film 150 can prevent an electric current flow generated by a touch input device such as a finger on the transparent semiconductor layer 130. When a touch input is made by the touch input device, capacitive coupling is generated within the insulating protective film 150 and electric stimulation can be sensed based on such coupling.

The anti-fingerprint film 170 is formed on the insulating protective film 150. The anti-fingerprint film 170 can prevent user's fingerprints from being left on a surface of the functional thin film 100. Further, by preventing the user's fingerprints from being left, the anti-fingerprint film 170 can prevent accumulation of electric charges on the insulating protective film 150. Here, the anti-fingerprint film 170 (antistatic layer) may be made of a non-conductive material such as hydrocarbon and fluorocarbon in order to prevent accumulation of electric charges on the insulating protective film 150. Besides, although the anti-fingerprint film 170 has low durability, the used flexible substrate 112 may be able to be changed by new flexible substrate and thereby supplement its low durability.

Figure 4:
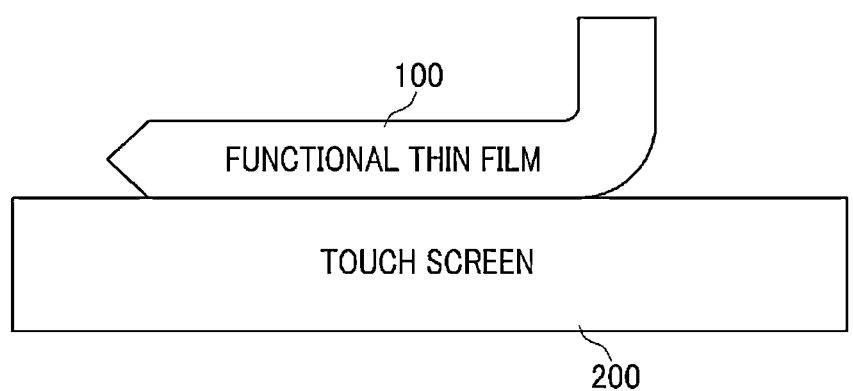
FIG. 4 is provided to show examples where the functional thin films of FIG. 2 and FIG. 3 are applied to a touch screen.

FIG. 4 is provided to show examples where the functional thin films of FIG. 2 and FIG. 3 are applied to a touch screen.

Referring to FIG. 4, the functional thin film 100 is different from the conventional electrosensory haptic screen illustrated in FIG. 1. The conventional electrosensory haptic screen is manufactured as a single product by stacking an electrosensory haptic screen on a touch screen. However, the functional thin film 100 can be separately manufactured from a touch screen and commercialized as a single thin film. That is, the functional thin film 100 uses the flexible substrate 112 configured as an OCA (optically clear adhesive) or a freely detachable film so as to be attached to any touch screen panel.

Accordingly, if a function of the functional thin film 100 is deteriorated due to repetitive uses, the functional thin film 100 can be removed from the touch screen and replaced with a new thin film.

Hereinafter, there will be explained a functional thin film forming method in accordance with an illustrative embodiment.

The functional thin film forming method relates to a method for forming the functional thin film 100 in accordance with an illustrative embodiment. The same components as explained in the functional thin film 100 in accordance with the above-described illustrative embodiment are assigned the same reference numerals and detailed explanations thereof will be briefly provided or omitted.

Figure 5:
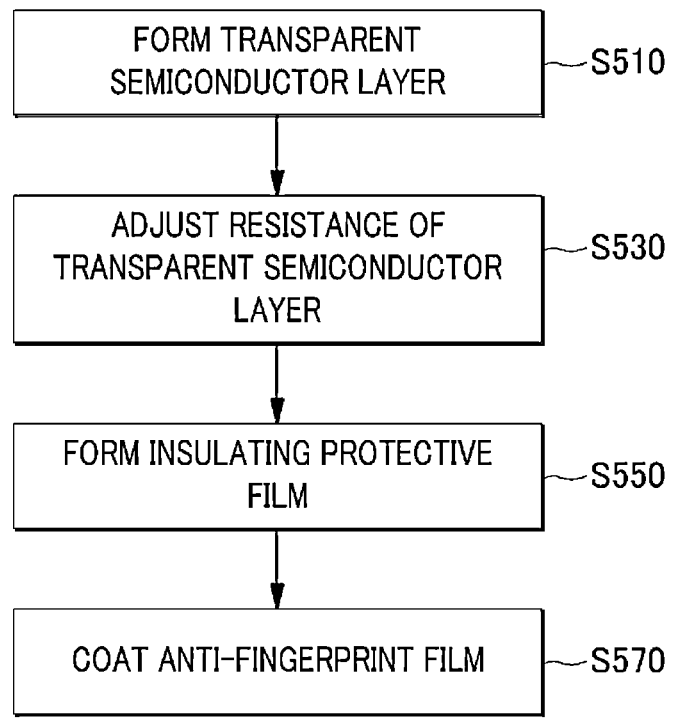
FIG. 5 is an explanatory diagram of a functional thin film forming method in accordance with an illustrative embodiment.

FIG. 5 is an explanatory diagram of a functional thin film forming method in accordance with an illustrative embodiment.

Referring to FIG. 5, the transparent semiconductor layer 130 is formed on a substrate by a sputtering method or a chemical vapor deposition method. The transparent semiconductor layer 130 formed in step S510 has a surface resistance of about 10 M$\Omega$/□ to about 100 M$\Omega$/□.

To be specific, the substrate provided in step S510 may be the transparent substrate 111. If the substrate provided in step S510 is the flexible substrate 112, the buffer layer 120 is formed on the flexible substrate 112 and then the transparent semiconductor layer 130 is formed on the buffer layer 120. If the substrate provided in step S510 is the flexible substrate 112, the buffer layer 120 formed on the flexible substrate 112 is made of $SiO_X$ or $SiN_X$.

Then, a n-type doping process is performed on the transparent semiconductor layer 130 formed in step S510 to adjust a resistance of the transparent semiconductor layer 130 (S530). In step S530, the n-type doping process is performed on the transparent semiconductor layer 130 by using any one of aluminum, gallium, and boron. Further, in step S530, a n-type doping concentration can be adjusted by adjusting an injection amount of hydrogen as a reaction gas of the n-type doping process. In step S530, by adjusting the n-type doping concentration, a visible ray transmittance of the transparent semiconductor layer 130 can be adjusted.

Thereafter, the insulating protective film 150 made of $SiO_x$ is formed on the transparent semiconductor layer 130 of which a resistance is adjusted in step S530 (S550).

Subsequently, the anti-fingerprint film 170 for preventing fingerprints from being left on the insulating protective film 150 formed in step S550 is coated (S570).

In steps S510, S530, and S550, the buffer layer 120, the transparent semiconductor layer 130, and the insulating protective film 150 are formed by a sputtering method or a chemical vapor deposition method. In the illustrative embodiments, a horizontal facing target sputtering device or a PECVD device employing an auxiliary electrode improved over a sputtering device or a chemical vapor deposition device may be used to form the buffer layer 120, the transparent semiconductor layer 130, and the insulating protective film 150. Details thereof will be described later.

Figure 6:
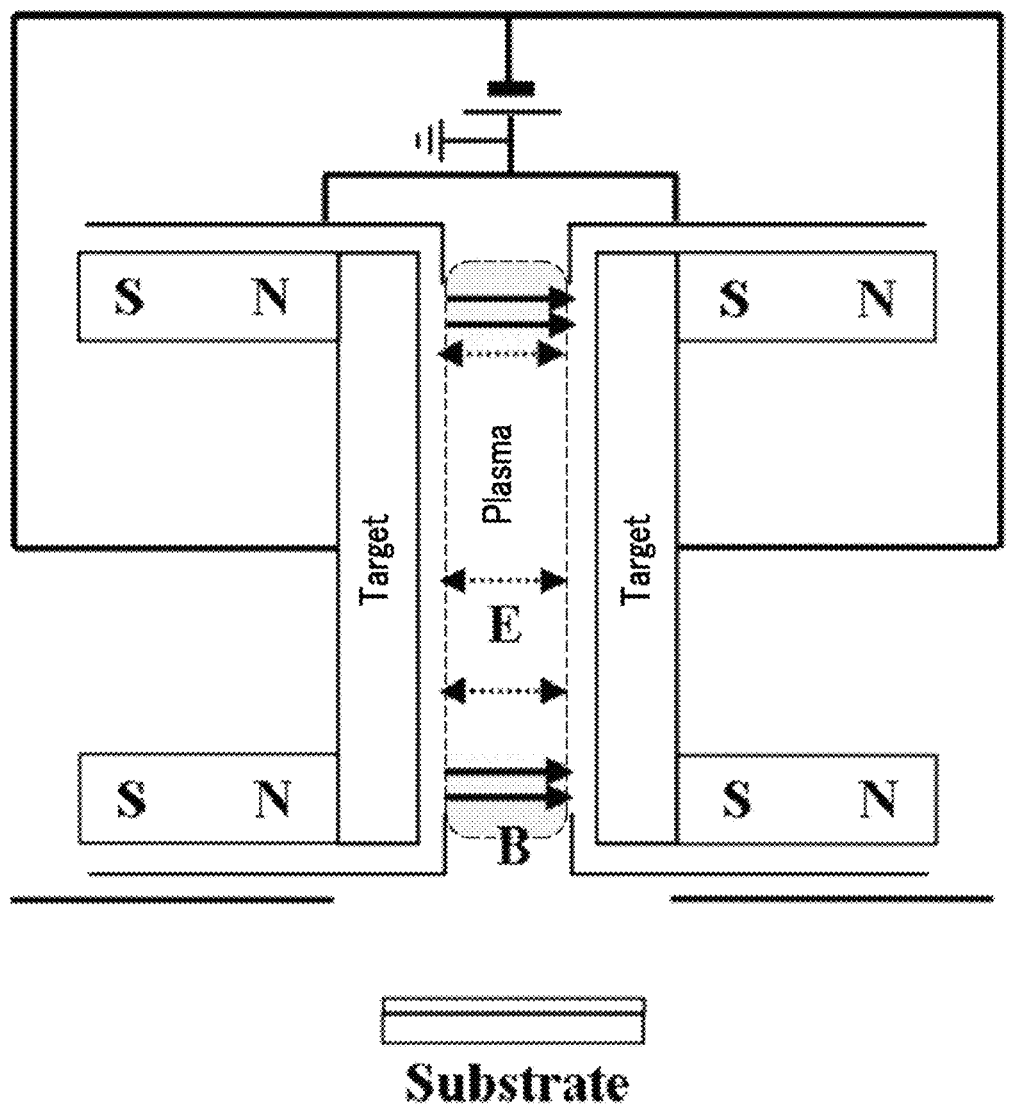
FIG. 6 illustrates a horizontal facing target sputtering device.

FIG. 6 illustrates a horizontal facing target sputtering device.

There will be explained a horizontal facing target sputtering method with reference to FIG. 6. A substrate including the buffer layer 120, the transparent semiconductor layer 130, and the insulating protective film 150 may be provided above or under the device. In this case, radicals having high energy are released from a target but do not have a direct influence on the substrate, and, thus, a thin film of high quality can be formed at a low temperature. If an injection amount of hydrogen used as a reaction gas is adjusted, the buffer layer 120, the transparent semiconductor layer 130, and the insulating protective film 150 of high quality can be formed at a low temperature.

If the horizontal facing target sputtering method is used, a temperature of the substrate and radical energy projected to the substrate as factors influencing a degree of crystallization of the thin film can be adjusted appropriately. To be specific, in the horizontal facing target sputtering method, the substrate is provided perpendicular to an electrode, so that an impact of radicals having high energy on the substrate can be minimized. Therefore, in the horizontal facing target sputtering method, there is no damage caused by the radicals and the thin film having a high degree of crystallization can be formed at a low temperature.

Figure 7:
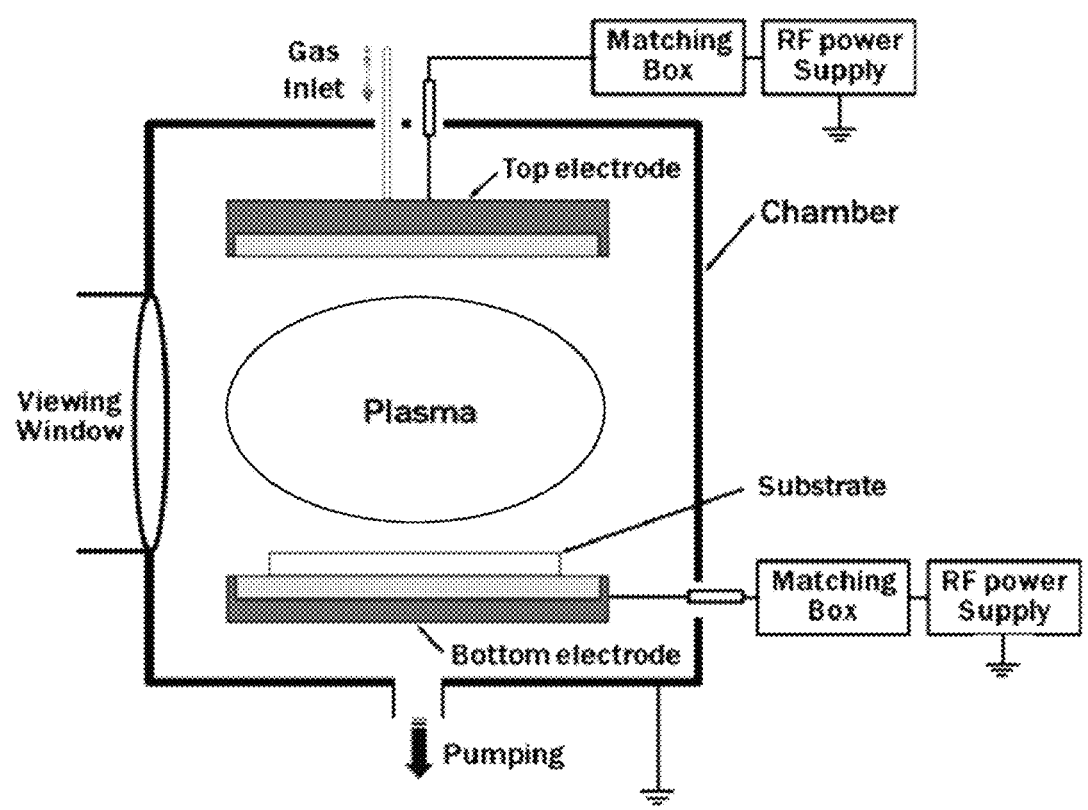
FIG. 7 illustrates a PECVD device employing an auxiliary electrode.

FIG. 7 illustrates a PECVD device employing an auxiliary electrode.

Referring to FIG. 7, the buffer layer 120, the transparent semiconductor layer 130, and the insulating protective film 150 can be formed by using the PECVD device employing an auxiliary electrode. A plasma density is increased and energy of radicals is controlled by independently adjusting a top electrode and a bottom electrode of the PECVD device employing an auxiliary electrode so as to form the buffer layer 120, the transparent semiconductor layer 130, and the insulating protective film 150 which are transparent in a visible ray region.

If ZnO is used as an oxide contained in the transparent semiconductor layer 130, a typical chemical vapor deposition process is performed by using dimethylzinc (DMZ) or diethylzinc (DEZ) as a precursor. However, in case of using dimethylzinc or diethylzinc as a source having a methyl group or an ethyl group, $CH_X$ can enter the thin film during the typical chemical vapor deposition process. If a chemical vapor deposition process is performed by using the PECVD device employing an auxiliary electrode, $CH_X$ can be sufficiently decomposed by controlling the bottom electrode so as to be discharged as a gas such as a $CH_4$, $H_2O$, CO or $CO_2$. Therefore, the thin film of high quality can be formed at a low temperature.

The above-described horizontal facing target sputtering method and PECVD employing an auxiliary electrode are very efficient methods to form a thin film of high quality at a low temperature. In particular, a material having flexibility as a feature of the illustrative embodiments may be weak in heat, and, thus, a low-temperature process is needed.

The above description of the present disclosure is provided for the purpose of illustration, and it would be understood by those skilled in the art that various changes and modifications may be made without changing technical conception and essential features of the present disclosure. Thus, it is clear that the above-described embodiments are illustrative in all aspects and do not limit the present disclosure. For example, each component described to be of a single type can be implemented in a distributed manner. Likewise, components described to be distributed can be implemented in a combined manner.

The scope of the present disclosure is defined by the following claims rather than by the detailed description of the embodiment. It shall be understood that all modifications and embodiments conceived from the meaning and scope of the claims and their equivalents are included in the scope of the present disclosure.

What is claimed is:

1. A functional thin film comprising:
a transparent substrate;
a transparent semiconductor layer that is formed on the transparent substrate and contains an oxide transparent in a visible ray region; and
an insulating protective film formed on the transparent semiconductor layer,
wherein a surface resistance of the transparent semiconductor layer is in a range of from 10 M$\Omega$/□ to 100 M$\Omega$/□.

2. The functional thin film of claim 1, further comprising:
an anti-fingerprint film formed on the insulating protective film.

3. The functional thin film of claim 1,
wherein the transparent semiconductor layer is doped with fluorine when $SnO_2$ is the oxide contained in the transparent semiconductor layer.

4. The functional thin film of claim 1,
wherein the transparent semiconductor layer is doped with any one of aluminum, gallium, and boron when ZnO is the oxide contained in the transparent semiconductor layer.

5. The functional thin film of claim 1,
wherein the transparent semiconductor layer has a film thickness in a range of from 1 nm to 100 nm.

6. The functional thin film of claim 1,
wherein the insulating protective film is made of $SiO_X$.

7. A functional thin film comprising:
a flexible substrate;
a buffer layer formed on the flexible substrate;
a transparent semiconductor layer that is formed on the buffer layer and contains an oxide transparent in a visible ray region;
an insulating protective film formed on the transparent semiconductor layer; and
an anti-fingerprint film formed on the insulating protective film,
wherein a surface resistance of the transparent semiconductor layer is in a range of from 10 M$\Omega$/□ to 100 M$\Omega$/□.

8. The functional thin film of claim 7,
wherein the flexible substrate is made of at least one of PET (polyethylene terephthalate), PC (polycarbonate), PI (polyimide), and PEN (polyethylene naphthalate).

9. The functional thin film of claim 7,
wherein the buffer layer is made of $SiO_X$ or $SiN_X$.

10. The functional thin film of claim 7,
wherein the transparent semiconductor layer is doped with fluorine when $SnO_2$ is the oxide contained in the transparent semiconductor layer.

11. The functional thin film of claim 7,
wherein transparent semiconductor layer is doped with any one of aluminum, gallium, and boron when ZnO is the oxide contained in the transparent semiconductor layer.

12. The functional thin film of claim 7,
wherein the insulating protective film is made of $SiO_X$.

13. The functional thin film of claim 1, wherein the transparent semiconductor layer is formed directly on the transparent substrate.

14. The functional thin film of claim 1, wherein the insulating protective film is formed directly on the transparent semiconductor layer.

15. The functional thin film of claim 7, wherein the buffer layer is formed directly on the flexible substrate.

16. The functional thin film of claim 7, wherein the transparent semiconductor layer is formed directly on the buffer layer.

17. The functional thin film of claim 7, wherein the insulating protective film is formed directly on the transparent semiconductor layer.

18. The functional thin film of claim 7, wherein the anti-fingerprint film is formed directly on the insulating protective film.

* * * * *